(12) United States Patent
Babb et al.

(10) Patent No.: US 6,569,508 B2
(45) Date of Patent: *May 27, 2003

(54) LABEL HAVING A PROTECTIVE CAVITY AND METHOD OF MANUFACTURE

(75) Inventors: Susan M. Babb, Pewaukee, WI (US); Evert M. Berndt, New Berlin, WI (US); Timothy J. Pomroy, Menomonee Falls, WI (US)

(73) Assignee: Brady Worldwide, Inc., Milwaukee, WI (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/822,706

(22) Filed: Mar. 30, 2001

(65) Prior Publication Data

US 2001/0014377 A1 Aug. 16, 2001

Related U.S. Application Data

(63) Continuation-in-part of application No. 09/229,407, filed on Jan. 13, 1999, now Pat. No. 6,262,692.

(51) Int. Cl.[7] .............................................. G06K 19/02
(52) U.S. Cl. ...................... 428/40.1; 340/570; 340/572; 343/894; 343/895; 343/897; 428/40.2; 428/41.8; 428/41.9; 428/42.1; 428/131; 428/137; 428/189
(58) Field of Search ............................. 428/40.1, 40.2, 428/41.8, 41.9, 42.1, 131, 137, 189; 343/895, 894, 897; 340/570, 572

(56) References Cited

U.S. PATENT DOCUMENTS

| | | | |
|---|---|---|---|
| 5,528,222 A | 6/1996 | Moskowitz et al. | 340/572 |
| 5,566,441 A | 10/1996 | Marsh et al. | 29/600 |
| 5,654,693 A | 8/1997 | Cocita | 340/572 |
| 5,705,852 A | 1/1998 | Orihara et al. | 257/679 |
| 5,708,419 A | 1/1998 | Isaacson et al. | 340/572 |
| 5,751,256 A | 5/1998 | McDonough et al. | 343/873 |
| 6,025,054 A | 2/2000 | Tiffany, III | 428/189 |
| 6,147,662 A | 11/2000 | Grabau et al. | 343/895 |
| 6,262,692 B1 * | 7/2001 | Babb | 343/895 |
| 6,429,831 B2 * | 8/2002 | Babb | 343/895 |

FOREIGN PATENT DOCUMENTS

| | | |
|---|---|---|
| EP | 0 682 321 A | 11/1995 |
| EP | 0 768 620 A2 | 4/1997 |
| WO | 98 54002 A | 12/1998 |

OTHER PUBLICATIONS

Byron A. Hunter, "Chemical Blowing Agents Chemistry And Decomposition Mechanisms", Uniroyal Chemical, Aug. 1991.

"Introduction To Expancel Microspheres", Expancel/Nobel Industries, Apr. 1991.

* cited by examiner

Primary Examiner—Nasser Ahmad
(74) Attorney, Agent, or Firm—Quarles & Brady LLP

(57) ABSTRACT

A label includes an inlay including a conductive material. A sheet is fixed over at least a portion of the inlay, and has a first surface and a second surface. A protective material is fixed to the first surface of the sheet, and an aperture extending through the protective material and sheet is positioned over at least a portion of the conductive material to define a protective cavity. A device is disposed in the protective cavity, and electrically connected to the conductive material, wherein the protective cavity surrounds the device. In another aspect of the present invention, the protective material is expandable from an unexpanded height to an expanded height, and the expanded height is at least 10% greater than the unexpanded height.

27 Claims, 6 Drawing Sheets

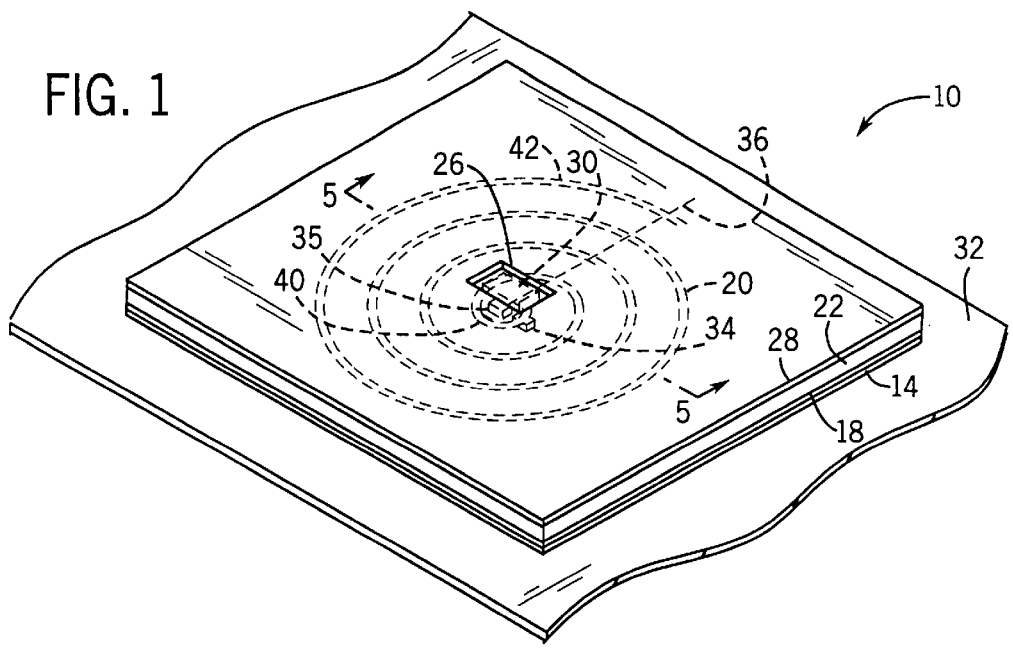
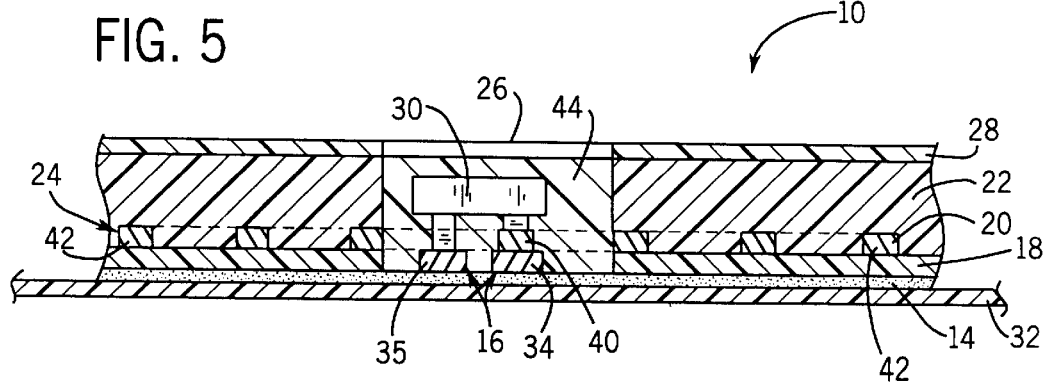

LABEL HAVING A PROTECTIVE CAVITY AND METHOD OF MANUFACTURE

CROSS REFERENCE TO RELATED APPLICATIONS

This application is a continuation-in-part of patent application Ser. No. 09/229,407 filed on Jan. 13, 1999 now U.S. Pat. No. 6,262,692.

STATEMENT REGARDING FEDERALLY SPONSORED RESEARCH OR DEVELOPMENT (Not Applicable)

BACKGROUND OF THE INVENTION

The field of invention is labels, more particularly a label having a protective cavity and method of manufacture.

RFID devices are known in the art, such as disclosed in U.S. Pat. No. 5,347,263. These devices are used in systems for access control, animal feeding and health programs, inventory control, process control, and security applications.

A typical RFID system has a passive RFID label having circuitry therein and a separate RFID reader/writer. The RFID reader/writer energizes the RFID label circuitry by transmitting a power signal. The power signal may convey data which is stored in memory incorporated in the RFID label circuitry. In response to the power signal the RFID label circuitry may transmit a response signal containing data stored in its memory. The RFID reader/writer receives the response signal and interprets the data contained therein. The data is then transmitted to a host computer for processing.

In order to minimize the cost of labels, the labels are fabricated in large quantities. One particular method of making the RFID label is to fabricate an RFID inlay by printing a conductive material, such as silver conductive ink, in a pattern defining multiple antennae, onto a substrate. The ink may be printed using silk screening techniques, such as in a sheet fed or roll operation. Once the antennae are printed, each antenna is die cut into individual inlays. Each inlay is placed in a carrier where an integrated circuit (IC) chip, such as a flip chip, is electrically connected to the antenna using conventional chip attachment methods. The chip is then encapsulated in an epoxy material and the entire assembly is sandwiched between protective layers.

This particular method of making an RFID label has several drawbacks. The inlay substrate material is expensive and when die cut, there is significant waste. Once the individual antennae are die cut into individual inlays, each inlay must be loaded into a carrier for subsequent processing. If a window is not cut into the inlay substrate, when the chip is encapsulated, there is a bump on the label which can result in the chip being easily ripped off of the label, or crushed, rendering the label inoperative. Finally, the bump on the chip makes putting the label through marking equipment, such as thermal transfer, ink jet, or laser printers, difficult.

Another method of manufacturing an RFID label, described in U.S. Pat. 5,528,222, has an antenna formed as an integral part of an insulating substrate and a circuit chip mounted on the substrate. This particular label requires an inlay substrate which significantly increases the label thickness and the overall cost of the label. To minimize the label thickness, a window may be cut in the inlay substrate allowing insertion of the chip into the window. Cutting a window in the substrate, however, further increases the cost of the label. Therefore, a need exists for a label which does not require cutting a window in the inlay substrate to minimize the bump.

BRIEF SUMMARY OF THE INVENTION

The present invention provides a label having a protective cavity and a method for making the label. The label includes an inlay including a conductive material. A sheet is fixed over at least a portion of the inlay, and has a first surface and a second surface. A protective material is fixed to the first surface of the sheet, and an aperture extending through the protective material and sheet is positioned over at least a portion of the conductive material to define a protective cavity. A device is disposed in the protective cavity, and electrically connected to the conductive material, wherein the protective cavity surrounds the device. In another aspect of the present invention, the protective material is expandable from an unexpanded height to an expanded height, and the expanded height is at least 10% greater than the unexpanded height.

A general objective of the invention is to provide a label which is easy and economical to manufacture. The label can be formed by depositing a protective material onto a sheet, forming an aperture in the protective material and sheet, and then fixing the sheet over an inlay to form a protective cavity over the inlay. The label is easily formed using known methods and equipment to economically and easily manufacture the label.

Another objective of the present invention is to provide a label having a device that does not form a bump on the label surface. This objective is accomplished by forming a cavity in the label for receiving the device. The cavity provides a receptacle for receiving the device and avoiding a bump on the label.

The foregoing and other objectives and advantages of the invention will appear from the following description. In the description, reference is made to the accompanying drawings which form a part hereof, and in which there is shown by way of illustration a preferred embodiment of the invention.

BRIEF DESCRIPTION OF THE DRAWINGS

FIG. 1 is a perspective view of an RFID label incorporating the present invention;

FIG. 5 is a sectional view of the label of FIG. 1 along line 5—5;

DETAILED DESCRIPTION OF THE PREFERRED EMBODIMENTS

Figure 2:
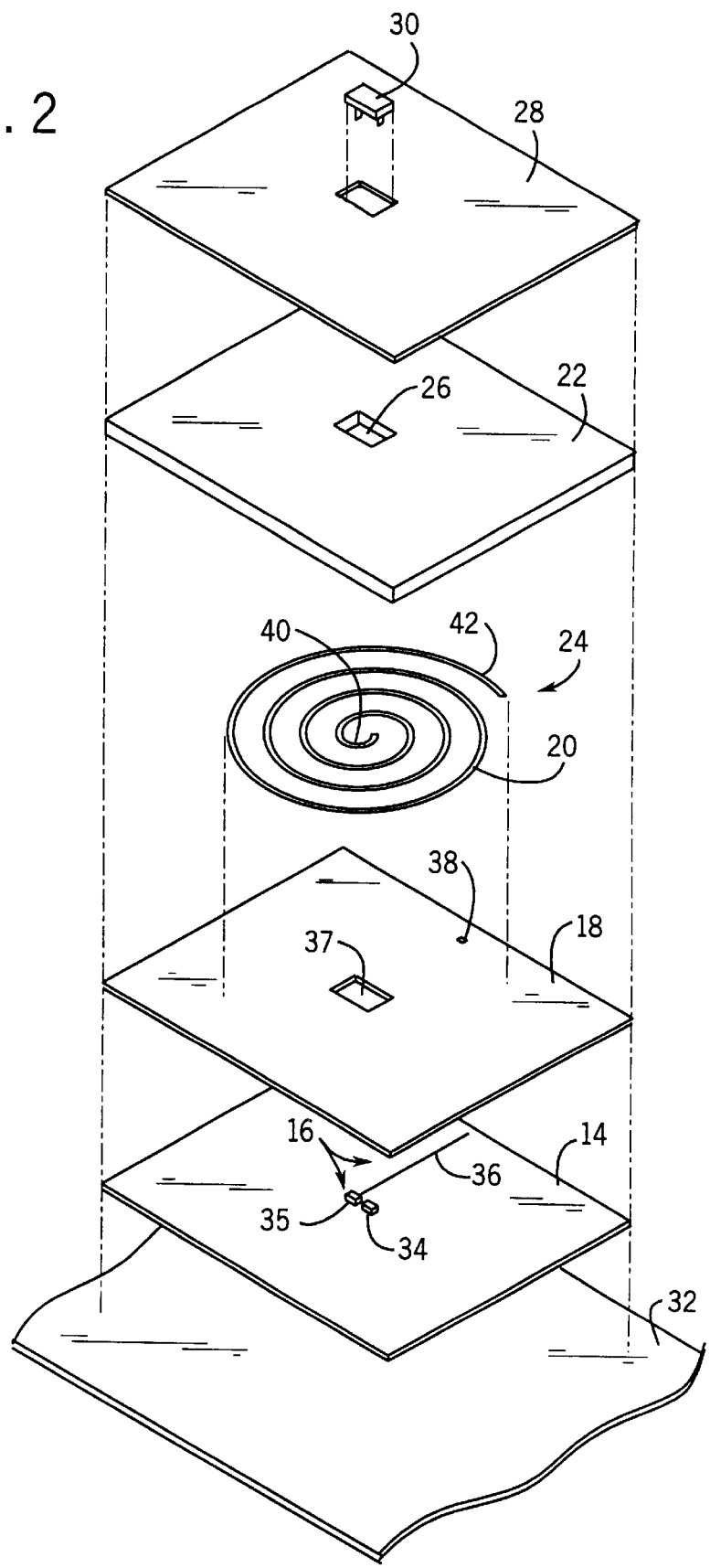
FIG. 2 is an exploded perspective view of the label of FIG. 1.

Referring to FIGS. 1, 2, and 5, a laminated RFID label 10 has five layers 14, 16, 18, 20, and 22, and forms a protective cavity 26 for RFID circuitry in the form of an IC chip 30. One of the layers 22 defines the cavity 26 for the IC chip 30, which is electrically connected to an antenna 24. The label 10 may be encapsulated or receive additional protective or functional layers 28 suitable for specific applications.

Referring to FIGS. 2 and 5, the first layer 14 is an adhesive material which is deposited on a release liner 32. The release liner is preferably a silicone coated paper. However, any liner having releasable properties may be used without departing from the scope of the present invention. By forming the label 10 on the release liner 32, a substrate is not required, thus reducing the cost of the label 10.

The adhesive first layer 14 may be a UV curable pressure sensitive adhesive, such as Acheson ML25251 available from Acheson Colloids Company, Port Huron, Mich. This layer 14 provides an adhesive surface for the finished label 10 and defines the boundary of the label area of the generally rectangular label 10. Although, the label 10 described herein is generally rectangular, the label 10 may be any shape without departing from the scope of the present invention.

The second layer 16 is an electrically conductive material which is selectively deposited onto the first layer 14. It is formed of a metallic conductive ink, such as Acheson Electrodag® 479SS available from Acheson Colloids Company, Port Huron, Mich. The second layer 16 may be deposited using silk screening, or other methods known in the art for depositing an electrically conductive material, such as electro deposition, hot stamping, etching or the like.

As shown best in FIG. 2, the electrically conductive material 16 is deposited onto portions of the first layer 14 defining at least two landing pads 34, 35 for IC chip attachment and a cross over pass 36. The landing pads 34, 35 provide electrical attachment pads for electrically connecting the fourth layer 20 to the IC chip 30. As more clearly described below, in cooperation with the third layer 18, the cross over pass 36 electrically connects one of the landing pads 34, 35 to a portion of the antenna 24 without shorting out other antenna portions. Although two landing pads 34, 35 are described herein, more than two landing pads 34, 35 may be formed for connecting to the IC chip 30 without departing from the scope of the present invention.

Figure 3:
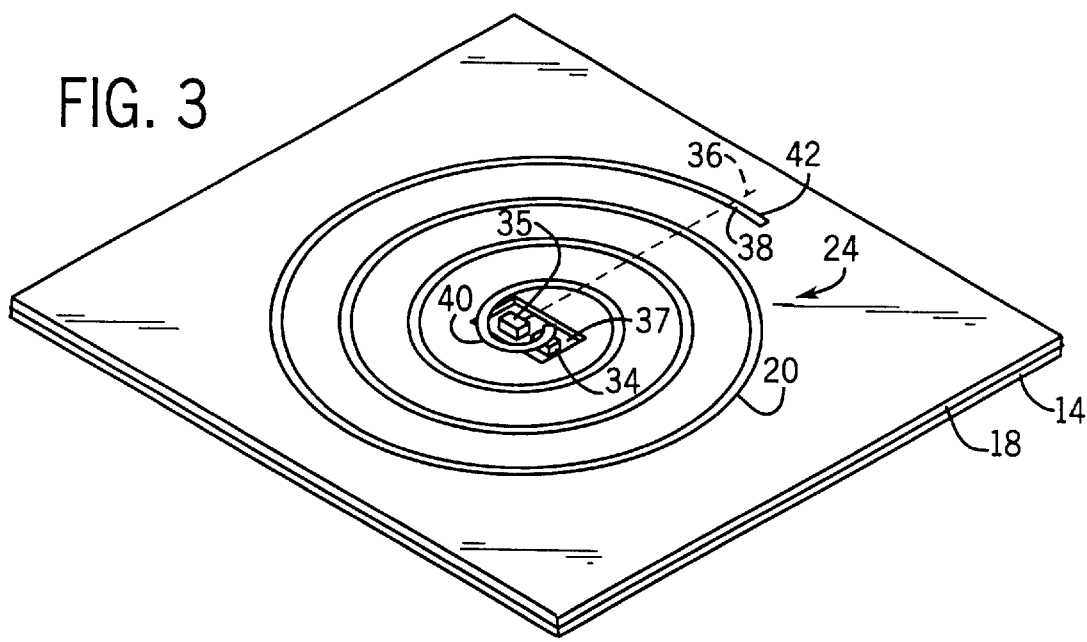
FIG. 3 is a partial perspective view of the label of FIG. 1 showing the first four layers.
Figure 4:
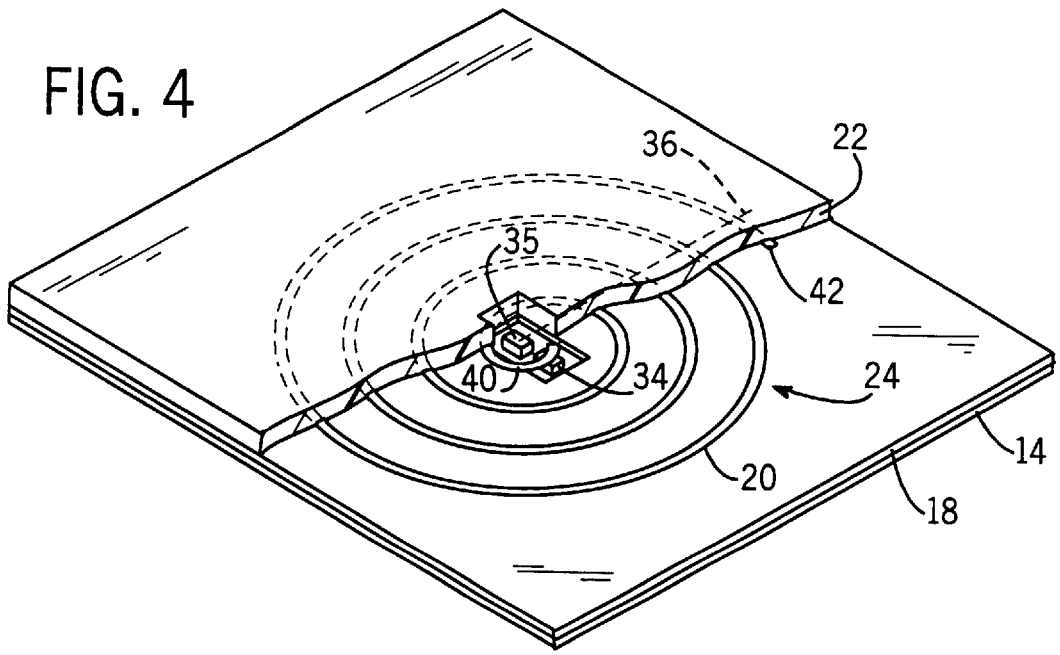
FIG. 4 is a cut-away perspective view of the label of FIG. 1.

Referring to FIGS. 2 and 3, the third layer 18 is a dielectric material, such as Acheson Electrodag® 451SS available from Acheson Colloids Company, Port Huron, Mich. It is deposited within the label boundary and it has an annular shape which surrounds a small central area 37 containing the landing pads 34, 35. The central area 37 is thus not coated with the dielectric material 18. The area 37 is sized to accommodate the IC chip 30 which is mounted over and electrically connected to the landing pads 34, 35. A conductive via 38 for electrically connecting the cross over pass 36 to the fourth layer 20 is also formed by leaving a small portion of the cross over pass 36 uncoated by the dielectric material 18.

Looking at FIGS. 2 and 3, the fourth layer 20 is a metallic conductive ink, such as used in the second layer 16. It is deposited onto the dielectric third layer 18 in a spiral pattern defining an antenna 24. The spiral antenna 24 has a plurality of rings including an inner ring 40 and an outer ring 42. The antenna inner ring 40 is electrically connected to one of the landing pads 34, 35. The antenna outer ring 42 is deposited over the via 38 electrically connecting the antenna outer ring 42 to the other landing pad 35 through the cross over pass 36 without electrically contacting the other antenna rings. Although a spiral antenna is preferred and described herein, any suitable antenna shape may be used without departing from the scope of the present invention.

As shown in FIGS. 1 and 2, the fifth layer 22 is shaped substantially the same as the dielectric layer 18. It is formed from an expandable material, such as a thermally expandable spacer ink comprising a binder of a polymeric resin system and an expandable additive, such as thermoplastic hollow spheres encapsulating a gas, or a blowing agent.

Preferably, the additive is thermally expandable, such as the thermoplastic hollow spheres, Expancel® 551DU, available from Expancel, Inc., Duluth, Ga. Although Expancel® 551DU is preferred, other expandable additives, such as Expancel® 091DU, Expancel® 461DU, or blowing agents may be used without departing from the scope of the present invention. For example, blowing agents, such as diazoaminobenzene, azobis(isobutyronitrile), dinitroso pentamethylene tetramine, N, N'-dinitroso-N, N'-dimethylterephthalamide, azodicarbonamide, sulfonyl hydrazides, benzene sulfonyl hydrazide, p-toluene sulfonyl hydrazide, p, p-oxybis(benzene sulfonyl hydrazide), sulfonyl semicarbazides, decomposition products of p-toluene sulfonyl semicarbazide, esters of azodicarboxylic acid, and salts of azodicarboxylic acid are known in art and may be combined with the binder to form the expandable layer.

The polymeric resin system includes a resin and a solvent to provide a flexible vehicle which does not degrade upon expansion of the expandable additive. The resin is preferably a polyester, however it could also be a vinyl, ethylene vinyl acetate, acrylic, polyurethane, or a combination thereof, which is mixed with a compatible solvent, such as methyl ethyl ketone, toluene, cyclohexane, glycol ether, or the like.

The expandable fifth layer 22 is formulated, such that upon curing, it expands to a thickness substantially equal to the thickness of the epoxy encapsulated IC chip 30. A precured thickness of the expandable material is less than half of the cured thickness. Preferably, the expandable material can expand to a thickness which is at least 10% greater than the thickness of the uncured expandable material. Most preferably, the expandable material can expand to a thickness which is at least 25% greater than the thickness of the uncured expandable material.

For a chip height of approximately 0.35 mm, the expandable material preferably comprises no more than about 85% solvent, no more than about 30% resin, and no more than about 15% expandable additive. In the preferred embodiment, the expandable layer 22 comprises approximately 70% solvent, 23% resin, and 7% expandable additive. Typical chip heights range from approximately 0.25–0.9 mm and, of course, a different chip height will require a different combination of materials to provide the desired expansion of the expandable material. Although, the cured expandable material preferably has a thickness substantially equal to the thickness of the encapsulated IC chip, any cured expandable material thickness greater or less than the IC chip height will provide some protection to the chip and may be used without departing from the scope of the invention.

Following deposition of the expandable layer 22, the label 10 is cured causing the layer 22 to expand. As shown in FIGS. 1, 2, 4, and 5, the cured expanded material surrounds the landing pads 34, 35 and defines a protective cavity 26 for receiving the IC chip 30 and an epoxy encapsulant 44. Advantageously, by providing the preferred cavity 26 for the IC chip 30 and the encapsulant 44, the IC chip 30 does not form an exposed bump on the finished label 10.

Preferably, the IC chip 30 is a flip chip having a memory and easily electrically connected to the landing pads 34, 35 using conventional chip attachment methods. For example, once the protective cavity 26 is formed, a conductive adhesive, such as a needle dispensed polymeric conductive adhesive or an anisotropic conductive adhesive, is deposited into the cavity to electrically connect the chip 30 to each of the landing pads 34, 35. The IC chip 30 is then placed into the cavity 26 and encapsulated in the epoxy 44. The epoxy 44 deposited into the cavity 26 further protects the IC chip 30 and secures it in place. Although encapsulating the IC chip 30 with the epoxy 44 is described herein, encapsulating the chip is not required to practice the invention and in certain applications may not be desired.

One or more additional layers 28, such as a polymeric resin system which can include resins and solvents described above, may be deposited onto the fifth layer 22. The additional layers 28 may provide a layer which is compatible with thermal transfer, ink jet, or laser printing.

Alternatively, an overlaminate may be deposited on the expandable layer 22 or subsequent layers 28 to provide an adhesive surface to the laminate article 10. An overlaminate is a film, such as a polyester, cellulose acetate, vinyl, polyethylene, polypropylene, styrene, or the like, mixed with an adhesive, such as an acrylic or rubber.

In the embodiment disclosed in FIGS. 1–5, each layer 14, 16, 18, 20, and 22 is formed using a silk screening process. The silk screening process may be a sheet fed operation or a roll to roll process. The sheet fed operation will result in sheets of multiple up labels or individual labels. The roll to roll process can supply rolls of labels in addition to sheet forms provided in the sheet fed method.

Deposition of layer material on the central area 37 around the landing pads 34, 35 can be prevented by placing, a releasable material, such as foam with a releasable adhesive, over the central area 37 during the silk screening process. Another method includes mounting the chip 30 prior to applying the expandable layer 22 and then notching the squeegee used in the silk screen printing process to avoid striking the chip 30.

Although silk screening is disclosed, other printing or deposition techniques, such as rotogravure, may also be used without departing from the scope of the present invention. Regardless of the particular technique chosen, the same process is preferably used to sequentially form each layer 14, 16, 18, 20, and 22 of the laminate article 10.

Figure 6:
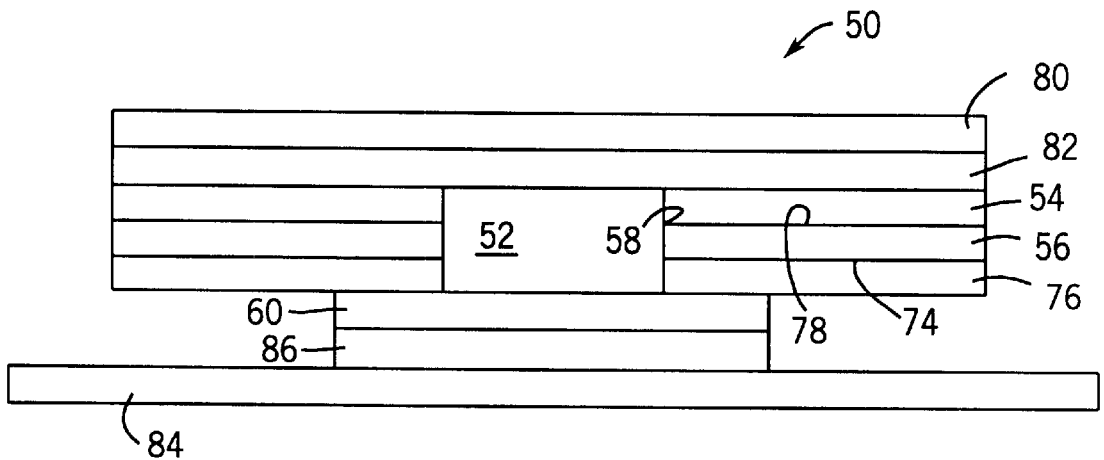
FIG. 6 is a schematic sectional view of another label incorporating the present invention.
Figure 8:
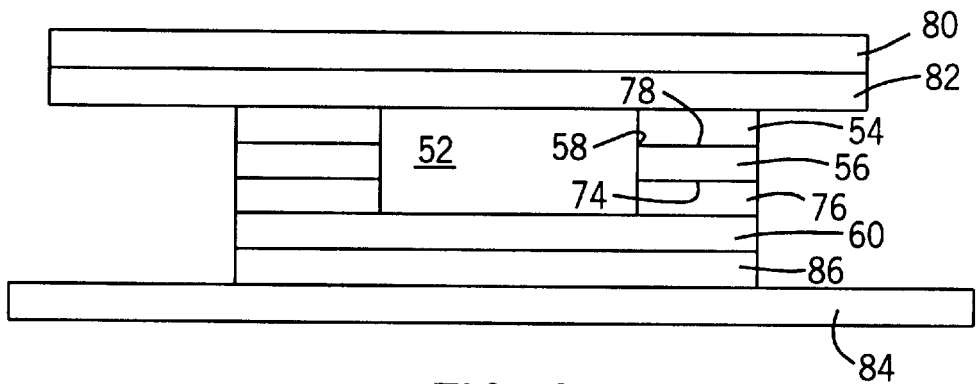
FIG. 8 is an alternate sectional view of the label of FIG. 7.
Figure 7:
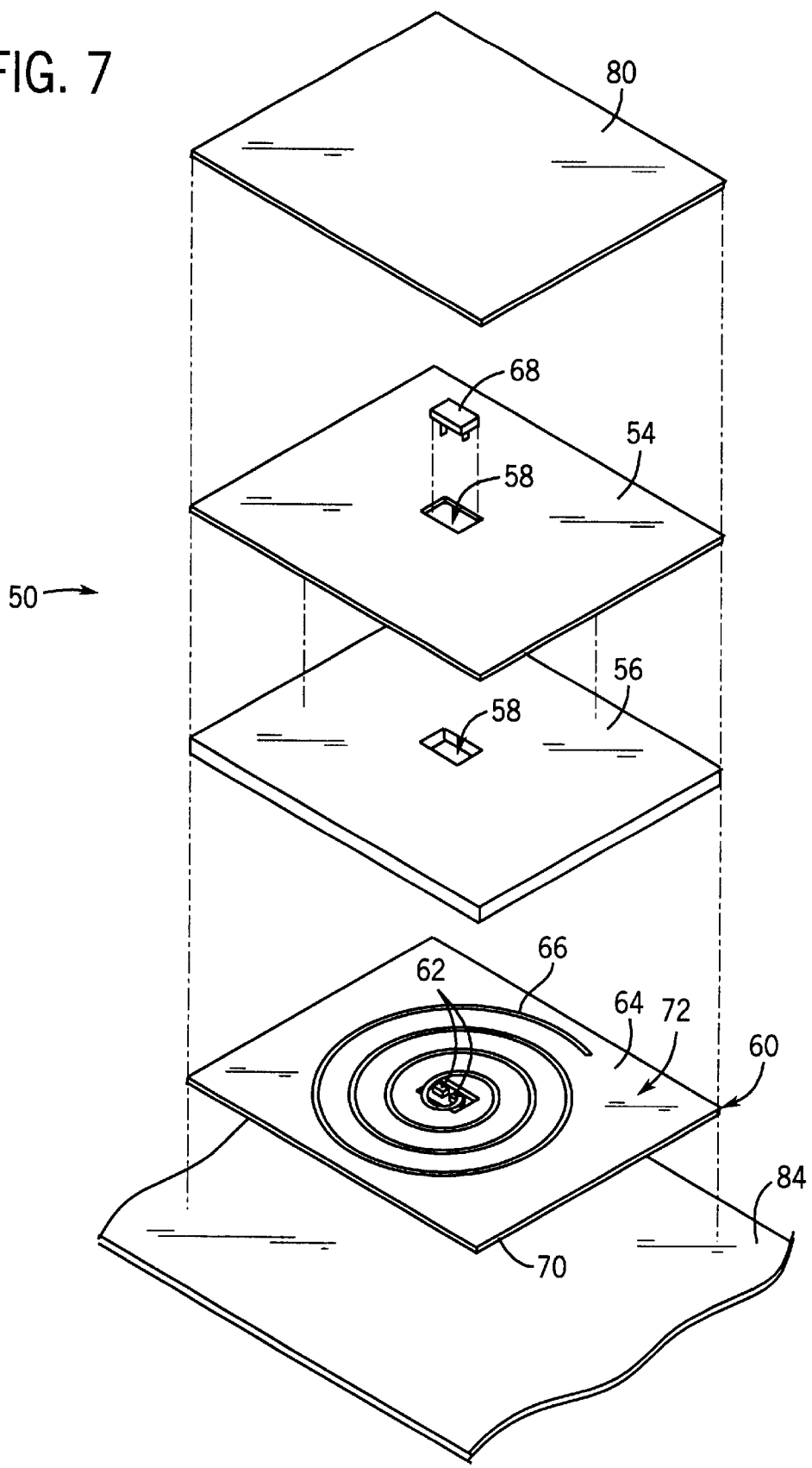
FIG. 7 is an exploded perspective view of the label of FIG. 6.

In another embodiment shown in FIGS. 6–8, an RFID label 50 includes a cavity 52 formed in a protective material 54 deposited onto a sheet 56. An aperture 58 is formed through the protective material 54 and sheet 56 to form the cavity 52 when the sheet 56 is fixed over an RFID inlay 60. Depositing the protective material 54 onto the sheet 56 and forming the aperture 58 through the protective material 54 and sheet 56 before the sheet 56 is fixed to the RFID inlay 60 simplifies manufacturing of the label 50.

Looking particularly at FIGS. 5 & 7, the RFID inlay 60 is an assembly including inlay components, such as electrical attachment pads 62, a dielectric 32 material 64, and an antenna 66, such as provided by layers 16, 18, and 20, for use with a device 68, such as an integrated circuit chip 30, of the first embodiment. The inlay components can be fixed to a flexible substrate 70, such as a polyester substrate, which is sized to accommodate the inlay components. Although, an RFID inlay 60 is disclosed, any inlay suitable for mounting a device 68, such as a diode, non-RFID integrated circuit chip, battery, and the like, thereon which protrudes above a surface 72 of the inlay 60, can be used without departing from the scope of the present invention.

Referring back to FIGS. 6 and 7, the sheet 56 is, preferably, a thin sheet of flexible material, such a polyester sheet having a thickness of approximately 1 to 4 mils. The sheet 56 includes a downwardly facing surface 74 which is fixed over the inlay 60. Preferably, the sheet 56 is fixed to the inlay 60 using a pressure sensitive adhesive 76, such as disclosed above, which is deposited onto the sheet downwardly facing surface 74.

The adhesive 76 can be deposited using any methods known in the art, such as the methods disclosed herein. Although a pressure sensitive adhesive is preferred, other methods known in the art for fixing the sheet 56 over the inlay 60 can be used, such as contact adhesives, ultrasonic welding, chemically bonding, mechanically bonding, and the like, can be used without departing from the scope of the present invention.

An upwardly facing surface 78 of the sheet 56 is coated with the protective material 54 which can protect the device 68 mounted on the inlay 60. The protective material 54 is, preferably, an expandable material which expands when cured, such as disclosed in the first embodiment. The protective material 54 is applied to the sheet upwardly facing surface 78 using deposition methods known in the art, such as reverse roll, slot-die, meyer rod, gravure, spray coating, ink jet, and the like. Although coating the sheet 56 with an expandable protective material is preferred, the protective material 54 can be fixed to the sheet 56, such as by using an adhesive, without departing from the scope of the present invention.

Preferably, the protective material 54 is flexible and has a coefficient of thermal expansion which is approximately equal to the coefficient of thermal expansion of the inlay substrate 70. For example, a protective material comprising a polyester resin is preferred for use with an inlay comprising a polyester substrate. Advantageously, the polyester protective material 54 can cover the polyester inlay and shield the inlay components from damaging chemicals and moisture. Moreover, a wax can be added to the protective material 54 to increase flexibility.

The aperture 58 is formed in the protective material 54 and sheet 56, and positioned over the inlay 60, to define the protective cavity 52 for the device 68 disposed in the cavity 52. The aperture 58 can be formed using methods known in the art, such as die cutting, punching, and the like. In addition, the aperture 58 can be preformed in the sheet 56, and the protective material 54 can be applied to the sheet 56, such that coating the sheet 56 with the protective material 54 does not close the preformed aperture 58 in the sheet 56.

The device 68 is an RFID integrated circuit chip disposed in the cavity 52 and electrically connected to the inlay attachment pads 62. Although an RFID integrated circuit chip is preferred, any device or object disposed in the cavity 52, such as a diode, non-RFID integrated circuit chip, battery, non-electrical object, and the like, can be used without departing from the scope of the present invention. As in the first embodiment, the device 68 can be encapsulated in epoxy to further protect the device 68. However, encapsulating the device 68 is not required to practice the invention.

A thermal transfer compatible face sheet 80 is fixed over the protective material 54 using an adhesive 82. Although a single face sheet is disclosed, as in the first embodiment, one or more additional layers or sheets of material, such as a polymeric resin system comprising resins and solvents described above, can be deposited over the protective material 54 without departing from the scope of the invention. Advantageously, face sheet 80 or other additional layers can provide a medium which is compatible with thermal transfer, ink jet, laser printing, and the like.

Preferably, the label 50 is releasably fixed to a release label carrier strip 84, such as a silicone coated paper, using an adhesive 86. Any carrier strip having releasable properties may be used without departing from the scope of the present invention.

Figure 9:
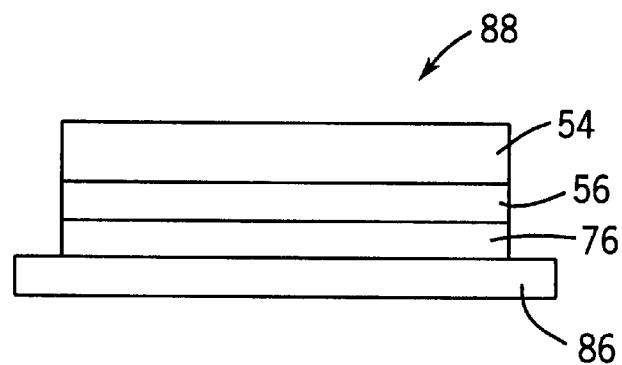
FIG. 9 is a schematic sectional view of an intermediate assembly for making the label of FIG. 7.

In one embodiment, the label 50 is made by depositing the protective material 54 in liquid form onto the sheet upwardly facing surface 78, and depositing the adhesive 76 onto the sheet downwardly facing surface 74. If the protective material 54 is expandable, the protective material 54 is then cured to expand the material 54 to an expanded height. The aperture 58 can then be formed through the protective material 54 and sheet 56. Preferably, the sheet 56 having the protective material 54 thereon is then fixed to a temporary releasable carrier strip 86, such as shown in FIG. 9 to provide an intermediate assembly 88 which can be stored until required to make the label 50. Advantageously, the intermediate assembly 88 can be wound up on a roll (not shown) to be stored for later use.

When assembling the label 50, the temporary releasable carrier strip 88 is detached from the sheet 56 having the protective material 54 thereon, and the aperture 58 is positioned over at least a portion of the RFID inlay 60. The sheet 56 is adhesively fixed to the inlay 60 and label carrier strip 84 if the sheet 56 extends past the inlay perimeter. The device 68 is then deposited into the protective cavity 52 formed by the aperture 58, and electrically connected to the attachment pads 62. If desired, an encapsulant is deposited into the cavity 52 to encapsulate the device 68. Of course, the device 68 can be fixed to the inlay 60 prior to fixing the protective material 54 over the inlay 60 without departing from the scope of the present invention. The face sheet 80 is then fixed over the protective material 54, such as by adhesively fixing the face sheet 80 to the protective material 54 or depositing a liquid layer of material which when cured is compatible with thermal transfer, ink jet, or laser printing.

Figure 10:
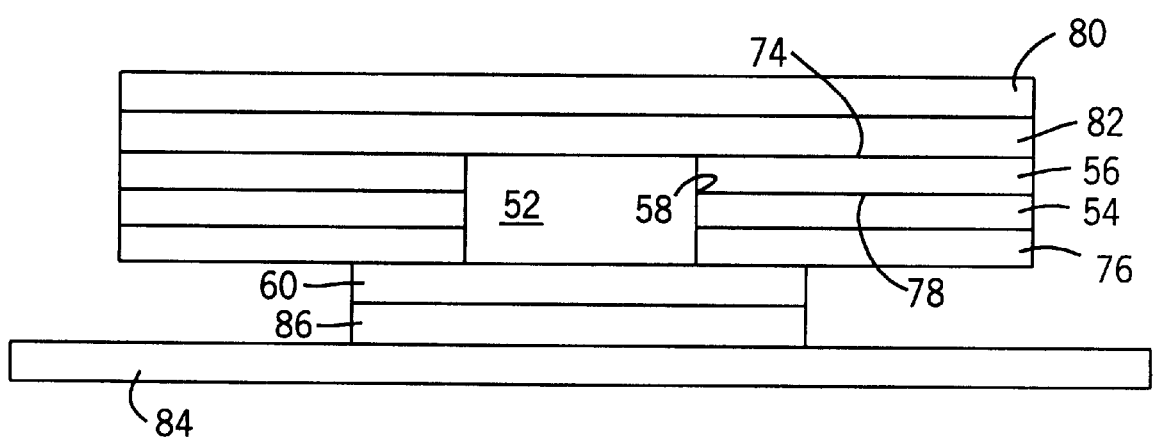
FIG. 10, is a schematic sectional view of yet another label incorporating the present invention.

Advantageously, the protective material 54 and sheet 56 can be applied over the inlay 60 and label carrier strip 84 to provide a label 50 having a substantially uniform thickness, such as shown in FIG. 6. Alternatively, the protective material 54 and sheet 56 can be applied to cover only the inlay 60, such as shown in FIG. 8, or portion thereof, to minimize the amount of protective material 54 used, and thus the cost of the label. In another alternative shown in FIG. 10, the adhesive 76 can be applied to the protective material 54, and the protective material 54 can face the inlay 60 and be adhesively fixed to the inlay 60 without departing from the scope of the present invention.

While there has been shown and described what is at present considered the preferred embodiment of the invention, it will be obvious to those skilled in the art that various changes and modifications can be made therein without departing from the scope of the invention defined by the appended claims. For example, the inlay can be a substrate void of inlay components, and the device can be a non-electrical object disposed in the cavity, and viewed through a transparent face sheet.

We claim:

1. A label comprising:
an inlay including;
an expandable material fixed over at least a portion of said inlay, said material being expandable from an unexpanded height to an expanded height, wherein said expanded height is at least 10% greater than said unexpanded height; and
an aperture formed in said expandable material, and defining a protective cavity above said inlay, wherein said expanding the expandable material increases the height of the protective cavity.

2. The label as in claim 1, in which said inlay includes:
a substrate;
a first conductive material deposited onto said substrate, and shaped to define two electrical attachment pads;
a dielectric material deposited onto said substrate, and surrounding said attachment pads and extending outward therefrom to form a label boundary; and
a second conductive material deposited onto said dielectric material and shaped to form an antenna having two portions which electrically connect to the respective attachment pads.

3. The label as in claim 1, in which said expandable material is fixed to a sheet which is fixed over said inlay.

4. The label as in claim 3, in which at least one of said sheet and said expandable material is adhesively fixed to said inlay.

5. The label as in claim 3, in which said sheet is adhesively fixed over said inlay.

6. The label as in claim 1, in which said inlay is releasably fixed to a carrier strip.

7. The label as in claim 2, in which a device is disposed in said cavity, and electrically connected to said first conductive material.

8. The label as in claim 7, further comprising an encapsulating material encapsulating said device in said protective cavity.

9. The label as in claim 1, in which said expanded height is at least 25% greater than said unexpanded height.

10. The label as in claim 1, in which said expandable material is selected from a group consisting of a thermally expandable ink and a binder including an expandable additive.

11. The label as in claim 10, wherein said binder is a polymeric resin system.

12. The label as in claim 11, wherein said polymeric resin system comprises a resin selected from the group consisting of a polyester, vinyl, ethylene vinyl acetate, acrylic, polyurethane, or a combination thereof.

13. The label as in claim 11, wherein said polymeric resin system comprises a solvent selected from the group consisting of methyl ethyl ketone, toluene, cyclohexane and a glycol ether.

14. The label as in claim 10, wherein said expandable additive is thermoplastic hollow spheres containing a gas.

15. The label as in claim 10, wherein said expandable additive is a blowing agent.

16. A label comprising:
an inlay including a conductive material;
a sheet fixed over at least a portion of said inlay, and having a first surface and a second surface;
a protective material fixed to said first surface of said sheet;
an aperture extending through said protective material and said sheet, and positioned over at least a portion of said conductive material to define a protective cavity; and
a device disposed in said protective cavity, and electrically connected to said conductive material, wherein said protective cavity surrounds said device.

17. The label as in claim 16, in which at least one of said sheet and said protective material is adhesively fixed to said inlay.

18. The label as in claim 16, in which said inlay is releasably fixed to a carrier strip.

19. The label as in claim 16, in which an adhesive is applied to said second sheet surface, and said adhesive fixes said sheet over at least a portion of said inlay.

20. The label as in claim 16, in which said protective material is expandable to an expanded height which is at least 10% greater than an unexpanded height.

21. The label as in claim 16, in which said protective material is expandable and selected from a group consisting of a thermally expandable ink and a binder including an expandable additive.

22. The label as in claim 21, wherein said binder is a polymeric resin system.

23. The label as in claim 22, wherein said polymeric resin system comprises a resin selected from the group consisting of a polyester, vinyl, ethylene vinyl acetate, acrylic, polyurethane, or a combination thereof.

24. The label as in claim 22, wherein said polymeric resin system comprises a solvent selected from the group consisting of methyl ethyl ketone, toluene, cyclohexane and a glycol ether.

25. The label as in claim 21, wherein said expandable additive is thermoplastic hollow spheres containing a gas.

26. The label as in claim 21, wherein said expandable additive is a blowing agent.

27. The label as in claim 16, in which a face sheet is fixed over said device.

\* \* \* \* \*